(12) United States Patent
Raskar et al.

(10) Patent No.: US 10,217,876 B2
(45) Date of Patent: Feb. 26, 2019

(54) POLY-SILOXANE CONTAINING ORGANIC VEHICLE FOR ELECTROCONDUCTIVE PASTES

(71) Applicant: Heraeus Precious Metals North America Conshohocken LLC, West Conshohocken, PA (US)

(72) Inventors: Devidas Raskar, Pune (IN); Yi Yang, Fort Washington, PA (US); Lixin Song, King of Prussia, PA (US); Guang Zhai, Blue Bell, PA (US)

(73) Assignee: HERAEUS PRECIOUS METALS NORTH AMERICA CONSHOHOCKEN LLC, West Conshohocken, PA (US)

( * ) Notice: Subject to any disclaimer, the term of this patent is extended or adjusted under 35 U.S.C. 154(b) by 49 days.

(21) Appl. No.: 15/468,780

(22) Filed: Mar. 24, 2017

(65) Prior Publication Data

US 2017/0200837 A1    Jul. 13, 2017

Related U.S. Application Data

(63) Continuation-in-part of application No. 15/226,546, filed on Aug. 2, 2016.
(Continued)

(51) Int. Cl.
   *H01B 1/16*      (2006.01)
   *H01L 31/0216*   (2014.01)
(Continued)

(52) U.S. Cl.
   CPC .......... *H01L 31/02167* (2013.01); *C03C 8/18* (2013.01); *C08L 83/04* (2013.01);
   (Continued)

(58) Field of Classification Search
   CPC .. C03C 8/18; C08L 83/04; H01B 1/16; H01L 31/00; H01L 31/02167; H01L 31/02168;
   (Continued)

(56) References Cited

U.S. PATENT DOCUMENTS

| 8,999,203 B2 | 4/2015 | Prince et al. |
| 2006/0102228 A1 | 5/2006 | Sridharan et al. |

(Continued)

FOREIGN PATENT DOCUMENTS

| EP | 2669899 A1 | 12/2013 |
| EP | 2897130 A1 | 7/2015 |

(Continued)

*Primary Examiner* — Mark Kopec
*Assistant Examiner* — Jaison P Thomas
(74) *Attorney, Agent, or Firm* — Blank Rome LLP

(57) ABSTRACT

The invention relates to a passivated emitter rear solar cell, comprising a silicon substrate having a front and back surface, a rear passivation layer on the back surface of the silicon substrate having a plurality of open holes formed therein, an aluminum back contact layer formed in the open holes of the rear passivation layer, and at least one backside soldering tab on the back surface of the silicon substrate. The backside soldering tab is formed from an electroconductive paste composition comprising conductive metallic particles, at least one lead-free glass frit, and an organic vehicle comprising at least one silicone oil.

20 Claims, 1 Drawing Sheet

Related U.S. Application Data

(60) Provisional application No. 62/232,796, filed on Sep. 25, 2015.

(51) Int. Cl.
| | |
|---|---|
| *H01L 31/0224* | (2006.01) |
| *H01L 31/18* | (2006.01) |
| *C03C 8/18* | (2006.01) |
| *C08L 83/04* | (2006.01) |
| *H01L 31/00* | (2006.01) |
| *H01L 31/028* | (2006.01) |

(52) U.S. Cl.
CPC ............... *H01B 1/16* (2013.01); *H01L 31/00* (2013.01); *H01L 31/028* (2013.01); *H01L 31/02168* (2013.01); *H01L 31/022425* (2013.01); *H01L 31/022441* (2013.01); *H01L 31/022483* (2013.01); *H01L 31/1864* (2013.01); *H01L 31/1884* (2013.01)

(58) Field of Classification Search
CPC ..... H01L 31/022425; H01L 31/022441; H01L 31/022483; H01L 31/028; H01L 31/1864; H01L 31/1884

See application file for complete search history.

(56) References Cited

U.S. PATENT DOCUMENTS

| | | | |
|---|---|---|---|
| 2009/0056798 A1* | 3/2009 | Merchant | H01B 1/16 136/256 |
| 2011/0120551 A1* | 5/2011 | Prince | H01B 1/22 136/256 |
| 2012/0152343 A1 | 6/2012 | Cheng et al. | |
| 2013/0126797 A1* | 5/2013 | Lee | H01B 1/22 252/512 |
| 2015/0007881 A1* | 1/2015 | Khadilkar | H01L 31/02242 136/256 |
| 2015/0249167 A1 | 9/2015 | Zhang | |

FOREIGN PATENT DOCUMENTS

| | | | | |
|---|---|---|---|---|
| EP | 2913140 A1 | 9/2015 | | |
| WO | WO-2012135551 A1 | 10/2012 | | |
| WO | WO-2013109466 A1 * | 7/2013 | ..... | H01L 31/022425 |
| WO | WO-2015039023 A1 | 3/2015 | | |

\* cited by examiner

POLY-SILOXANE CONTAINING ORGANIC VEHICLE FOR ELECTROCONDUCTIVE PASTES

RELATED APPLICATIONS

This is a continuation-in-part of U.S. patent application Ser. No. 15/226,546, filed Aug. 2, 2016, which claims priority to U.S. Provisional Application No. 62/232,796, filed Sep. 25, 2015. The entire contents of those applications are incorporated herein by reference.

TECHNICAL FIELD

This invention relates to an organic vehicle used in the formulation of electroconductive pastes. In one aspect, the organic vehicle includes at least one silicone oil and is used in an electroconductive paste for forming electrodes on passivated emitter rear solar cells. The invention is also directed to passivated emitter rear solar cells formed using the electroconductive pastes disclosed herein.

BACKGROUND

Solar cells are devices that convert the energy of light into electricity using the photovoltaic effect. Solar power is an attractive green energy source because it is sustainable and produces only non-polluting by-products. In operation, when light hits a solar cell, a fraction of the incident light is reflected by the surface and the remainder is transmitted into the solar cell. The photons of the transmitted light are absorbed by the solar cell, which is usually made of a semiconducting material such as silicon. The energy from the absorbed photons excites electrons of the semiconducting material from their atoms, generating electron-hole pairs. These electron-hole pairs are then separated by p-n junctions and collected by conductive electrodes which are applied on the solar cell surface. In this way, electricity may be conducted between interconnected solar cells.

Solar cells may have a variety of different structures. Conventional solar cells have an antireflection coating (ARC) applied to the front side of a semiconductor substrate, so as to reduce reflection of incident light. Front side electrodes, typically formed of electroconductive pastes, are applied on top of the antireflection coating in a grid-like pattern. Another electroconductive paste (which may be the same or different from the front side electroconductive paste) is applied to the backside of the solar cell to form backside electrodes/soldering pads. An aluminum paste is also applied to the backside of the substrate, overlapping the edges of the soldering pads, to form a back surface field which improves solar cell performance.

One specific type of solar cell is a passivated emitter rear cell ("PERC"). In conventional solar cells, the aluminum paste is applied directly to the back surface of the solar cell substrate to form the back surface field. In a PERC solar cell, a rear passivation layer, typically formed of a dielectric material such as alumina, is first applied to the back surface of the substrate. Additional rear surface layers, such as a silicon nitride capping layer, may be applied on top of the rear passivation layer. Next, portions of the rear passivation layer and additional rear layers are removed to expose areas of the underlying substrate. This step may be achieved by, for example, acid etching or laser drilling. The aluminum electroconductive paste is then applied on top of the rear layers, thus filling in the "holes" created during the removal process. In these areas, a local back surface field is formed when the aluminum paste is fired. The backside soldering tabs may be applied to the back surface either before or after the application of the aluminum paste. A standard solar cell and an exemplary PERC solar cell are illustrated in FIGS. 1 and 2. PERC solar cells have been shown to have increased efficiency compared to solar cells that do not have a rear passivation layer.

The electroconductive paste compositions used to form the front side and backside electrodes are specifically formulated for their particular application. A typical electroconductive composition contains metallic particles, an inorganic component, and an organic vehicle. With respect to the pastes used to form the backside soldering tabs on a PERC solar cell, they are typically formed using silver as the metallic particles, glass frit as the inorganic component, and an organic vehicle. These PERC backside pastes are designed to have limited or no chemical reactivity with the underlying substrate layers, such as the rear passivation layer and capping layer, so as to avoid damage to those layers which results in decreased electrical performance of the solar cell.

Accordingly, there is a need for electroconductive compositions which are highly conductive and which have limited chemical reactivity with the underlying surface layers of the PERC solar cell substrate. In particular, electroconductive compositions for use in forming backside soldering tabs on a PERC solar cell that do not damage the rear passivation or capping layers and which improve electrical performance of the cell are desired.

SUMMARY

The organic vehicle of the invention provides an electroconductive paste with improved electrical performance in PERC solar cells.

In one aspect of the invention, a passivated emitter rear solar cell is provided. The passivated emitter rear solar cell includes a silicon substrate having a front and back surface, a rear passivation layer on the back surface of the silicon substrate having a plurality of open holes formed therein, an aluminum back contact layer formed in the open holes of the rear passivation layer, and at least one backside soldering tab on the back surface of the silicon substrate. The backside soldering tab is formed from an electroconductive paste composition comprising conductive metallic particles, at least one lead-free glass frit, and an organic vehicle comprising at least one silicone oil.

The invention further provides a method of preparing a passivated emitter rear solar cell, including the steps of applying a backside electroconductive paste composition to a rear surface of a silicon substrate having at least one rear passivation layer formed thereon, the rear passivation layer having a plurality of open holes formed therein to expose areas of the silicon substrate, applying an aluminum electroconductive paste composition in the open holes of the rear passivation layer to contact the silicon substrate, and heating the silicon substrate. The backside electroconductive paste composition comprises conductive metallic particles, at least one lead-free glass frit, and an organic vehicle comprising at least one silicone oil.

DESCRIPTION OF DRAWINGS

A more complete appreciation of the invention and many of the attendant advantages thereof will be readily obtained as the same becomes better understood by reference to the following detailed description when considered in connection with the accompany drawings, wherein.

DETAILED DESCRIPTION

Figures 1, 2:
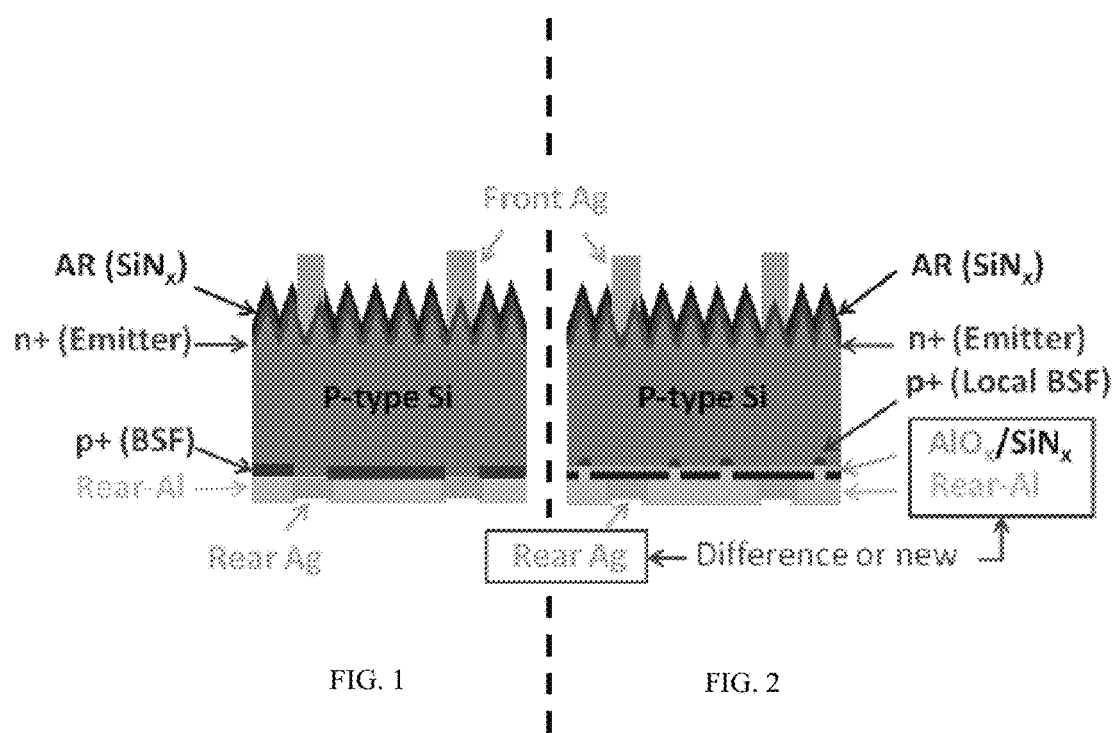
FIG. 1 is a side cross-sectional view of a standard solar cell.
FIG. 2 is a side cross-sectional view of a PERC solar cell.

Electroconductive pastes used to form solar cell electrodes generally include conductive metallic particles, glass frit(s), an organic vehicle, and optional additive(s). The organic vehicle of the invention is useful in forming electroconductive paste compositions for backside soldering tabs on PERC solar cells having improved electrical properties.

Organic Vehicle

The organic vehicle of the invention provides the media by which the conductive metallic particles and glass frit are applied to the silicon surface to form the backside soldering tabs. Preferred organic vehicles are solutions, emulsions or dispersions formed of one or more solvents, preferably organic solvent(s), which ensure that the components of the paste are present in a dissolved, emulsified or dispersed form. Organic vehicles which provide optimal stability of the components of the electroconductive composition and which improve the electrical performance of the resulting PERC solar cell are preferred.

In one embodiment, the organic vehicle is present in the electroconductive composition in an amount of at least about 5 wt %, preferably at least about 10 wt %, more preferably at least about 15 wt %, more preferably at least about 20 wt %, and most preferably at least 25 wt %, based upon 100% total weight of the electroconductive paste composition. At the same time, the organic vehicle is preferably no more than about 60 wt %, preferably no more than about 55 wt %, and more preferably no more than about 50 wt %, based upon 100% total weight of the electroconductive paste composition.

In a preferred embodiment, the organic vehicle comprises at least one poly-siloxane compound. A poly-siloxane compound is a compound having multiple siloxane functional groups having Si—O—Si linkage. In a preferred embodiment, the poly-siloxane compound is silicone oil, which is a liquid polymerized siloxane with organic side chains. The use of a poly-siloxane compound in an electroconductive paste composition is shown to minimizing etching of the rear surface layers of a PERC solar cell, thus improving the open circuit voltage (Voc) and efficiency (Eta) of PERC solar cells. Any silicone oils that are suitable for use in an electroconductive paste composition may be used. In a preferred embodiment, silicone oils having a viscosity of about 1-40 kcps are used, preferably silicone oils having a viscosity of about 1-10 kcps, such as about 5 kcP, or silicone oils having a viscosity of about 25-35 kcps, such as about 30 kcps. The viscosity is measured according to the methods set forth herein.

In one embodiment, the organic vehicle comprises at least about 0.5 wt % silicone oil, based upon 100% total weight of the organic vehicle. At the same time, the organic vehicle comprises no more than about 20 wt % silicone oil, preferably no more than about 15 wt %, and most preferably no more than about 13 wt %.

With respect to the paste composition as a whole, the silicone oil is preferably present in an amount of at least 0.1 wt %, and preferably at least about 0.2 wt %, more preferably at least 0.5 wt %, and most preferably at least 1 wt %, based upon 100% total weight of the electroconductive paste. At the same time, the silicone oil is preferably present in an amount of no more than about 10 wt %, preferably no more than about 5 wt %, based upon 100% total weight of the electroconductive paste. In a preferred embodiment, the silicone oil is preferably present in an amount of no more than about 4 wt %, based upon 100% total weight of the electroconductive paste. In yet another preferred embodiment, the paste composition includes about 0.2 to about 3.5 wt % silicone oil, preferably about 1 to about 3 wt %.

In one embodiment, the poly-siloxane compound(s) are incorporated into the electroconductive paste separately from the organic vehicle or any other paste components. The poly-siloxane compound(s) may be added together with the other paste components, i.e., the conductive metallic particles, glass frit, and organic vehicle, or the poly-siloxane compound(s) may be added to the paste composition once the paste components have already been combined. In a preferred embodiment, the poly-siloxane compound(s) are mixed together with the at least one solvent before being combined with the remaining organic vehicle components. In one embodiment, the interaction of the solvent and the poly-siloxane is observed in order to determine if they mix well or separate out when combined.

In one embodiment, the organic vehicle further comprises at least one organic solvent and at least one resin (e.g., a polymer). In a preferred embodiment, the organic vehicle comprises at least one organic solvent, at least one resin, at least one poly-siloxane compound(s), or any combination thereof.

Preferred resins are those which contribute to the formation of an electroconductive composition with favorable printability and viscosity. All resins which are known in the art, and which are considered to be suitable in the context of this invention, may be employed as the resin in the organic vehicle. Preferred resins include, but are not limited to, polymeric resins, monomeric resins, and resins which are a combination of polymers and monomers. Polymeric resins can also be copolymers wherein at least two different monomeric units are contained in a single molecule. Preferred polymeric resins are those which carry functional groups in the polymer main chain, those which carry functional groups off of the main chain, and those which carry functional groups both within the main chain and off of the main chain. Preferred polymers carrying functional groups in the main chain include, for example, polyesters, substituted polyesters, polycarbonates, substituted polycarbonates, polymers which carry cyclic groups in the main chain, poly-sugars, substituted poly-sugars, polyurethanes, substituted polyurethanes, polyamides, substituted polyamides, phenolic resins, substituted phenolic resins, copolymers of the monomers of one or more of the preceding polymers, optionally with other co-monomers, or a combination of at least two thereof. According to one embodiment, the resin may be polyvinyl butyral or polyethylene. Preferred polymers which carry cyclic groups in the main chain include, for example, polyvinylbutylate (PVB) and its derivatives and poly-terpineol and its derivatives or mixtures thereof. Preferred poly-sugars include, for example, cellulose and alkyl derivatives thereof, preferably methyl cellulose, ethyl cellulose, hydroxyethyl cellulose, propyl cellulose, hydroxypropyl cellulose, butyl cellulose and their derivatives and mixtures of at least two thereof. Other preferred polymers include, for example, cellulose ester resins, e.g., cellulose acetate propionate, cellulose acetate butyrate, and any combinations thereof. Preferred polymers which carry functional groups off of the main polymer chain include those which carry amide groups, those which carry acid and/or ester groups, often called acrylic resins, or polymers which carry a combination of aforementioned functional groups, or a combination thereof. Preferred polymers which carry amide off of the main chain include, for example, polyvinyl pyrrolidone (PVP) and its derivatives. Preferred polymers which carry acid and/or ester groups off of the main chain include, for example, polyacrylic acid and its derivatives, polymethacrylate (PMA) and its derivatives or polymethylmethacrylate (PMMA) and its derivatives, or a mixture thereof. Preferred monomeric resins are ethylene glycol based monomers, terpineol resins or rosin derivatives, or a mixture thereof. Preferred monomeric resins based on ethylene glycol are those with ether groups, ester groups, or those with an ether group and an ester group, preferred ether groups being methyl, ethyl, propyl, butyl, pentyl hexyl and higher alkyl ethers, the preferred ester group being acetate and its alkyl derivatives, preferably ethylene glycol monobutylether monoacetate or a mixture thereof. Estergum resin, polyvinyl butyrate, and ethyl cellulose are the most preferred resins. In one embodiment, ethyl cellulose is used as the binder.

The resin may be present in an amount of at least about 0.5 wt %, preferably at least about 1 wt %, and most preferably at least about 3 wt %, based upon 100% total weight of the organic vehicle. At the same time, the resin may be present in an amount of no more than about 10 wt %, and preferably no more than about 8 wt %, based upon 100% total weight of the organic vehicle. In one embodiment, the resin is present in an amount of about 5 wt %, based upon 100% total weight of the organic vehicle.

Preferred solvents are components which are removed from the paste to a significant extent during firing. Preferably, they are present after firing with an absolute weight reduced by at least about 80% compared to before firing, preferably reduced by at least about 95% compared to before firing. Preferred solvents are those which contribute to favorable viscosity and printability characteristics. All solvents which are known in the art, and which are considered to be suitable in the context of this invention, may be employed as the solvent in the organic vehicle. Preferred solvents are those which exist as a liquid under standard ambient temperature and pressure (SATP) (298.15 K, 25° C., 77° F.), 100 kPa (14.504 psi, 0.986 atm), preferably those with a boiling point above about 90° C. and a melting point above about −20° C. Preferred solvents are polar or non-polar, protic or aprotic, aromatic or non-aromatic. Preferred solvents include, for example, mono-alcohols, di-alcohols, poly-alcohols, mono-esters, di-esters, poly-esters, mono-ethers, di-ethers, poly-ethers, solvents which comprise at least one or more of these categories of functional group, optionally comprising other categories of functional group, preferably cyclic groups, aromatic groups, unsaturated bonds, alcohol groups with one or more O atoms replaced by heteroatoms, ether groups with one or more O atoms replaced by heteroatoms, esters groups with one or more O atoms replaced by heteroatoms, and mixtures of two or more of the aforementioned solvents. Preferred esters in this context include, for example, di-alkyl esters of adipic acid, preferred alkyl constituents being methyl, ethyl, propyl, butyl, pentyl, hexyl and higher alkyl groups or combinations of two different such alkyl groups, preferably dimethyladipate, and mixtures of two or more adipate esters. Preferred ethers in this context include, for example, diethers, preferably dialkyl ethers of ethylene glycol, preferred alkyl constituents being methyl, ethyl, propyl, butyl, pentyl, hexyl and higher alkyl groups or combinations of two different such alkyl groups, and mixtures of two diethers. Preferred alcohols in this context include, for example, primary, secondary and tertiary alcohols, preferably tertiary alcohols, terpineol and its derivatives being preferred, or a mixture of two or more alcohols. Preferred solvents which combine more than one different functional groups are 2,2,4-trimethyl-1,3-pentanediol monoisobutyrate, often called texanol, and its derivatives, 2-(2-ethoxyethoxy)ethanol, often known as carbitol, its alkyl derivatives, preferably methyl, ethyl, propyl, butyl, pentyl, and hexyl carbitol, preferably hexyl carbitol or butyl carbitol, and acetate derivatives thereof, preferably butyl carbitol acetate, or mixtures of at least two of the aforementioned. In a preferred embodiment, the solvent includes at least one of butyl carbitol, butyl carbitol acetate, terpineol, or mixtures thereof. These three solvents are believed to mix well with the poly-siloxane compounds.

The organic solvent may be present in an amount of at least about 50 wt %, and more preferably at least about 60 wt %, and more preferably at least about 70 wt %, based upon 100% total weight of the organic vehicle. At the same time, the organic solvent may be present in an amount of no more than about 95 wt %, and more preferably no more than about 90 wt %, based upon 100% total weight of the organic vehicle.

Surfactants known in the art may be used together with the poly-siloxane compound(s). Suitable surfactants are those which contribute to the formation of an electroconductive composition with favorable printability and viscosity characteristics. All surfactants which are known in the art, and which are considered to be suitable in the context of this invention, may be employed as the surfactant in the organic vehicle. Preferred surfactants are those based on linear chains, branched chains, aromatic chains, fluorinated chains, polyether chains and combinations thereof. Preferred surfactants include, but are not limited to, single chained, double chained or poly chained polymers. Preferred surfactants may have non-ionic, anionic, cationic, amphiphilic, or zwitterionic heads. Preferred surfactants may be polymeric and monomeric or a mixture thereof. Preferred surfactants may have pigment affinic groups, preferably hydroxyfunctional carboxylic acid esters with pigment affinic groups (e.g., DISPERBYK®-108, manufactured by BYK USA, Inc.), acrylate copolymers with pigment affinic groups (e.g., DISPERBYK®-116, manufactured by BYK USA, Inc.), modified polyethers with pigment affinic groups (e.g., TEGO® DISPERS 655, manufactured by Evonik Tego Chemie GmbH), and other surfactants with groups of high pigment affinity (e.g., Duomeen TDO® manufactured by Akzo Nobel N.V.). Other preferred polymers not in the above list include, but are not limited to, polyethylene oxide, polyethylene glycol and its derivatives, and alkyl carboxylic acids and their derivatives or salts, or mixtures thereof. The preferred polyethylene glycol derivative is poly(ethyleneglycol)acetic acid. Preferred alkyl carboxylic acids are those with fully saturated and those with singly or poly unsaturated alkyl chains or mixtures thereof. Preferred carboxylic acids with saturated alkyl chains are those with alkyl chains lengths in a range from about 8 to about 20 carbon atoms, preferably $C_9H_{19}COOH$ (capric acid), $C_{11}H_{23}COOH$ (lauric acid), $C_{13}H_{27}COOH$ (myristic acid) $C_{15}H_{31}COOH$ (palmitic acid), $C_{17}H_{35}COOH$ (stearic acid), or salts or mixtures thereof. Preferred carboxylic acids with unsaturated alkyl chains are $C_{18}H_{34}O_2$ (oleic acid) and $C_{18}H_{32}O_2$ (linoleic acid).

If present, the additional surfactant(s) may be at least about 0.5 wt %, based upon 100% total weight of the organic vehicle. At the same time, the surfactant is preferably no more than about 10 wt %, and preferably no more than about 8 wt %, based upon 100% total weight of the organic vehicle.

The organic vehicle may also comprise one or more thixotropic agents and/or other additives. Any thixotropic agent known to one having ordinary skill in the art may be used with the organic vehicle of the invention. For example, without limitation, thixotropic agents may be derived from natural origin or they may be synthesized. Preferred thixotropic agents include, but are not limited to, castor oil and its derivatives, inorganic clays, polyamides and its derivatives, fumed silica, carboxylic acid derivatives, preferably fatty acid derivatives (e.g., $C_9H_{19}COOH$ (capric acid), $C_{11}H_{23}COOH$ (lauric acid), $C_{13}H_{27}COOH$ (myristic acid) $C_{15}H_{31}COOH$ (palmitic acid), $C_{17}H_{35}COOH$ (stearic acid) $C_{18}H_{34}O_2$ (oleic acid), $C_{18}H_{32}O_2$ (linoleic acid)), or combinations thereof. Commercially available thixotropic agents, such as, for example, Thixotrol® MAX, Thixotrol® ST, or THIXCIN® E, may also be used.

According to one embodiment, the organic vehicle comprises at least about 1 wt % thixotropic agent, and preferably at least about 7 wt %, based upon 100% total weight of the organic vehicle. At the same time, the organic vehicle preferably includes no more than about 20 wt % thixotropic agent, preferably no more than about 15 wt %, based upon 100% total weight of the organic vehicle.

Preferred additives in the organic vehicle are those materials which are distinct from the aforementioned components and which contribute to favorable properties of the electroconductive composition, such as improved electrical performance and stability characteristics. Additives known in the art, and which are considered to be suitable in the context of the invention, may be used. Preferred additives include, but are not limited to, viscosity regulators, stabilizing agents, inorganic additives, thickeners, emulsifiers, dispersants and pH regulators. Where present, such additives are preferably no more than about 15 wt %, based upon 100% total weight of the organic vehicle.

The formulation of the organic vehicle may have an effect on the viscosity of the electroconductive paste composition, which in turn may affect its printability. If the viscosity is too high, the paste may not transfer well through the screen mesh and line breaks or low spots may occur. If the viscosity is too low, the paste may be too fluid, causing the printing lines to spread and the aspect ratio to decrease. As set forth herein, to measure viscosity of any of the paste components, a Brookfield HBDV-III Digital Rheometer equipped with a CP-44Y sample cup and a #51 cone was used. The temperature of the sample was maintained at 25° C. using a TC-502 circulating temperature bath. The measurement gap was set at 0.026 mm with a sample volume of approximately 0.5 ml. The sample was allowed to equilibrate for two minutes, and then a constant rotational speed of 1.0 rpm was applied for one minute. The viscosity of the sample after this interval was reported in units of kcps.

Conductive Metallic Particles

The electroconductive composition also comprises conductive metallic particles. Preferred conductive metallic particles are those which exhibit optimal conductivity and which effectively sinter upon firing, such that they yield electrodes with high conductivity. Conductive metallic particles known in the art suitable for use in forming solar cell electrodes are preferred. Preferred metallic particles include, but are not limited to, elemental metals, alloys, metal derivatives, mixtures of at least two metals, mixtures of at least two alloys or mixtures of at least one metal with at least one alloy.

In an embodiment of the invention, the electroconductive paste may comprise at least about 30 wt % metallic particles, preferably at least about 35 wt %, more preferably at least about 40 wt %, more preferably at least about 45 wt %, and most preferably at least about 50 wt %, based upon 100% total weight of the paste. In a preferred embodiment, the electroconductive paste comprises at least about 60 wt % metallic particles, based upon 100% total weight of the paste. At the same time, the electroconductive paste preferably includes no more than about 99 wt % metallic particles, preferably no more than about 95 wt %, more preferably no more than about 90 wt %, more preferably no more than about 85 wt %, more preferably no more than about 80 wt %, more preferably no more than about 75 wt %, more preferably no more than about 70 wt %, and more preferably no more than about 65 wt %, based upon 100% total weight of the paste composition. Electroconductive pastes having this conductive metallic particle content are suitable for use in forming backside soldering tabs on a PERC solar cell.

Metals which may be employed as the metallic particles include at least one of silver, copper, gold, aluminum, nickel, platinum, palladium, molybdenum, and mixtures or alloys thereof. In a preferred embodiment, the metallic particles are silver. The silver may be present as elemental silver, a silver alloy, or silver derivate. Suitable silver derivatives include, for example, silver alloys and/or silver salts, such as silver halides (e.g., silver chloride), silver oxide, silver nitrate, silver acetate, silver trifluoroacetate, silver orthophosphate, and combinations thereof. In another embodiment, the metallic particles may comprise a metal or alloy coated with one or more different metals or alloys, for example silver particles coated with aluminum or copper particles coated with silver.

The metallic particles may be present with a surface coating, either organic or inorganic. Any such coating known in the art, and which is considered to be suitable in the context of the invention, may be employed on the metallic particles. Preferred organic coatings are those coatings which promote dispersion into the organic vehicle. Preferred inorganic coatings are those coatings which regulate sintering and promote adhesive performance of the resulting electroconductive paste. If such a coating is present, it is preferred that the coating correspond to no more than about 5 wt %, preferably no more than about 2 wt %, and most preferably no more than about 1 wt %, based on 100% total weight of the metallic particles.

The conductive particles can exhibit a variety of shapes, sizes, and specific surface areas. Some examples of shapes include, but are not limited to, spherical, angular, elongated (rod or needle like) and flat (sheet like). Conductive metallic particles may also be present as a combination of particles with different shapes, such as, for example, a combination of spherical metallic particles and flake-shaped metallic particles.

Another characteristic of the metallic particles is its average particle size, $d_{50}$. The $d_{50}$ is the median diameter or the medium value of the particle size distribution. It is the value of the particle diameter at 50% in the cumulative distribution. Particle size distribution may be measured via laser diffraction, dynamic light scattering, imaging, electrophoretic light scattering, or any other methods known in the art. Specifically, particle size according to the invention is determined in accordance with ISO 13317-3:2001. As set forth herein, a Horiba LA-910 Laser Diffraction Particle Size Analyzer connected to a computer with an LA-910 software program is used to determine the median particle diameter. The relative refractive index of the metallic particle is chosen from the LA-910 manual and entered into the software program. The test chamber is filled with deionized water to the proper fill line on the tank. The solution is then circulated by using the circulation and agitation functions in the software program. After one minute, the solution is drained. This is repeated an additional time to ensure the chamber is clean of any residual material. The chamber is then filled with deionized water for a third time and allowed to circulate and agitate for one minute. Any background particles in the solution are eliminated by using the blank function in the software. Ultrasonic agitation is then started, and the metallic particles are slowly added to the solution in the test chamber until the transmittance bars are in the proper zone in the software program. Once the transmittance is at the correct level, the laser diffraction analysis is run and the particle size distribution of the metallic component is measured and given as d50.

It is preferred that the median particle diameter $d_{50}$ of the metallic particles be at least about 0.1 μm, and preferably at least about 0.5 μm. At the same time, the $d_{50}$ is preferably no more than about 5 μm, and more preferably no more than about 4 μm. In one embodiment, the electroconductive paste composition includes a combination of spherical silver particles and flake-shaped silver particles, in which the $d_{50}$ of the spherical silver particles is preferably less than or equal to about 3 μm and the $d_{50}$ of the flake-shaped silver particles is preferably less than or equal to about 5 μm.

Another way to characterize the shape and surface of a particle is by its specific surface area. Specific surface area is a property of solids equal to the total surface area of the material per unit mass, solid, or bulk volume, or cross sectional area. It is defined either by surface area divided by mass (with units of $m^2/g$) or surface area divided by volume (units of $m^{-1}$). The specific surface area may be measured by the BET (Brunauer-Emmett-Teller) method, which is known in the art. As set forth herein, BET measurements are made in accordance with DIN ISO 9277:1995. A Monosorb Model MS-22 instrument (manufactured by Quantachrome Instruments), which operates according to the SMART method (Sorption Method with Adaptive dosing Rate), is used for the measurement. As a reference material, aluminum oxide (available from Quantachrome Instruments as surface area reference material Cat. No. 2003) is used. Samples are prepared for analysis in the built-in degas station. Flowing gas (30% $N_2$ and 70% He) sweeps away impurities, resulting in a clean surface upon which adsorption may occur. The sample can be heated to a user-selectable temperature with the supplied heating mantle. Digital temperature control and display are mounted on the instrument front panel. After degassing is complete, the sample cell is transferred to the analysis station. Quick connect fittings automatically seal the sample cell during transfer, and the system is then activated to commence the analysis. A dewar flask filled with coolant is manually raised, immersing the sample cell and causing adsorption. The instrument detects when adsorption is complete (2-3 minutes), automatically lowers the dewar flask, and gently heats the sample cell back to room temperature using a built-in hot-air blower. As a result, the desorbed gas signal is displayed on a digital meter and the surface area is directly presented on a front panel display. The entire measurement (adsorption and desorption) cycle typically requires less than six minutes. The technique uses a high sensitivity, thermal conductivity detector to measure the change in concentration of an adsorbate/inert carrier gas mixture as adsorption and desorption proceed. When integrated by the on-board electronics and compared to calibration, the detector provides the volume of gas adsorbed or desorbed. For the adsorptive measurement, $N_2$ 5.0 with a molecular cross-sectional area of 0.162 $nm^2$ at 77K is used for the calculation. A one-point analysis is performed and a built-in microprocessor ensures linearity and automatically computes the sample's BET surface area in $m^2/g$.

According to one embodiment, the metallic particles may have a specific surface area of at least about 0.1 $m^2/g$, preferably at least about 0.2 $m^2/g$. At the same time, the specific surface area is preferably no more than 10 $m^2/g$, and more preferably no more than about 5 $m^2/g$. In one embodiment, the metallic particles have a specific surface area of between about 0.7 and 1.7 $m^2/g$.

Glass Frit

In an electroconductive paste used to form front side solar cell electrodes, the glass frit acts as an adhesion media, facilitating the bonding between the conductive particles and the silicon substrate, and thus providing good electrical contact therebetween. Specifically, upon firing, conventional glass frits etch through the surface layers (e.g., antireflective layer) of the silicon substrate, such that effective electrical contact can be made between the electroconductive paste and the silicon wafer.

Contrary to the traditional role of glass frits as used in electroconductive paste compositions, the glass frits of the invention are designed to exhibit minimal etching characteristics. Such a glass frit is particularly useful in forming backside soldering tabs on a PERC solar cell. Specifically, the glass frits described herein minimize etching of the rear surface layers of the PERC solar cell (e.g., rear passivation and capping layers), which in turn minimizes damage to those layers which would otherwise result in shunting and open circuit voltage losses and thus reduced solar cell efficiency. As such, the glass frits of the invention are designed to be low-etching and non-contact forming glasses.

In one embodiment, the glass frit(s) of the invention preferably have a low lead content or are lead-free, as lead is known to have strong etching properties with respect to surface layers on solar cells. As set forth herein, the term "low lead content" refers to a glass frit having a lead content of at least 0.5 wt % and less than about 5 wt %, such as less than about 4 wt %, less than about 3 wt %, less than about 2 wt %, less than about 1 wt %, and less than about 0.8 wt %, based upon 100% total weight of the glass frit. As set forth herein, the term "lead-free" refers to a glass frit having a lead content of less than about 0.5 wt %, preferably less than about 0.4 wt %, more preferably less than about 0.3 wt %, more preferably less than about 0.2 wt %, and most preferably less than about 0.1 wt % lead, based upon 100% total weight of the glass frit. In a most preferred embodiment, the glass frit comprises less than about 0.01 wt % lead, which may be present as an incidental impurity from the other glass components. In one preferred embodiment, the glass composition does not include any intentionally added lead.

In one aspect of the invention, the glass frit preferably comprises a relatively high content of silicon oxide ($SiO_2$), boron oxide ($B_2O_3$), and/or bismuth oxide ($Bi_2O_3$). These oxides typically function as glass forming oxides. In one embodiment, the total content of $SiO_2$, $B_2O_3$, and $Bi_2O_3$ is at least about 70 wt %, and preferably at least about 75 wt %, based upon 100% total weight of the glass frit. At the same time, the glass frit preferably comprises no more than about 90 wt % total content of $SiO_2$, $B_2O_3$, and $Bi_2O_3$, and preferably no more than about 85 wt %, based upon 100% total weight of the glass frit.

Further, the glass frit preferably includes at least one alkaline oxide, such as, for example, $Na_2O$, $Li_2O$, and/or $K_2O$. These alkaline oxides typically function as glass modifiers which decrease the chemical reactivity of the glass frit at elevated firing temperatures. Preferably, the glass frit includes a combination of at least two of these alkaline oxides, such as $Na_2O$ and $Li_2O$. In one embodiment, the glass frit includes at least about 5 wt %, preferably at least about 8 wt % total alkaline oxide(s), based upon 100% total weight of the glass frit. At the same time, the glass frit includes no more than about 20 wt % total alkaline oxide(s), preferably no more than about 15 wt %, based upon 100% total weight of the glass frit.

The glass frit may also include zinc oxide (ZnO). If the glass frit includes ZnO, it is present in an amount of no more than 15 wt %, preferably no more than 10 wt %, based upon 100% total weight of the glass frit.

The glass frit further includes at least one oxide of molybdenum (e.g., $MoO_3$), niobium (e.g., $Nb_2O_5$), aluminum, sulfur, selenium, tellurium, vanadium, and tungsten. In one embodiment, the glass frit preferably includes at least about 2 wt % $MoO_3$ and no more than about 5 wt %, based upon 100% total weight of the glass frit. If present, the glass frit includes less than about 2 wt % of $Nb_2O_5$.

The glass frit may include other elements, oxides, compounds which generate oxides upon heating, and/or mixtures thereof. In one embodiment, the glass frit may include other oxides or compounds known to one skilled in the art, including, but not limited to, magnesium, titanium, zirconium, nickel, gadolinium, antimony, cerium, zirconium, titanium, manganese, tin, ruthenium, cobalt, iron, copper, germanium, indium, alkaline earth metals, rare earth metals, phosphorous, and chromium, or any combination of at least two thereof, compounds which can generate those metal oxides upon firing, or a mixture of at least two of the aforementioned metals, a mixture of at least two of the aforementioned oxides, a mixture of at least two of the aforementioned compounds which can generate those metal oxides on firing, or mixtures of two or more of any of the above mentioned.

Preferred glass frits according to the invention are powders of amorphous or partially crystalline solids which exhibit a glass transition. The glass transition temperature $T_g$ is the temperature at which an amorphous substance transforms from a rigid solid to a partially mobile undercooled melt upon heating. Another important characteristic of the glass frits of the invention is the glass softening point, which is typically lower than the glass transition temperature and which identifies the point at which the glass begins to soften beyond some arbitrary point. Methods for the determination of the glass softening and glass transition temperatures are well known to the person skilled in the art. Specifically, the glass transition temperature $T_g$ may be determined using a DSC apparatus SDT Q600 (commercially available from TA Instruments) which simultaneously records differential scanning calorimetry (DSC) and thermogravimetric analysis (TGA) curves. The instrument is equipped with a horizontal balance and furnace with a platinum/platinum-rhodium (type R) thermocouple. The sample holders used are aluminum oxide ceramic crucibles with a capacity of about 40-90 µl. For the measurements and data evaluation, the measurement software Q Advantage; Thermal Advantage Release 5.4.0 and Universal Analysis 2000, version 4.5A Build 4.5.0.5 is applied respectively. As pan for reference and sample, aluminum oxide pan having a volume of about 85µl is used. An amount of about 10-50 mg of the sample is weighted into the sample pan with an accuracy of 0.01 mg. The empty reference pan and the sample pan are placed in the apparatus, the oven is closed and the measurement started. A heating rate of 10 K/min is employed from a starting temperature of 25° C. to an end temperature of 1000° C. The balance in the instrument is always purged with nitrogen ($N_2$ 5.0) and the oven is purged with synthetic air (80% $N_2$ and 20% $O_2$ from Linde) with a flow rate of 50 ml/min. The first step in the DSC signal is evaluated as glass transition using the software described above, and the determined onset value is taken as the temperature for $T_g$.

Preferably, the $T_g$ is below the desired firing temperature of the electroconductive paste. According to the invention, preferred glass frits have a $T_g$ of at least about 200° C., and preferably at least about 250° C. At the same time, preferred glass frits have a $T_g$ of no more than about 900° C., preferably no more than about 800° C., and most preferably no more than about 700° C. Further, in one embodiment, the glasses have a glass softening point of about 400-550° C., more preferably about 480-530° C. In another embodiment, the glasses have a glass softening point of about 650-800° C., preferably about 690-760° C.

It is well known to the person skilled in the art that glass frit particles can exhibit a variety of shapes, sizes, and surface area to volume ratios. The glass particles may exhibit the same or similar shapes (including length:width:thickness ratio) as may be exhibited by the conductive metallic particles, as discussed herein. Glass frit particles with a shape, or combination of shapes, which favor improved electrical contact of the produced electrode are preferred. It is preferred that the median particle diameter $d_{50}$ of the glass frit particles (as set forth above with respect to the conductive metallic particles) be at least about 0.1 µm. At the same time, it is preferred that the $d_{50}$ of the glass frit be no more than about 10 µm, more preferably no more than about 5 µm, and most preferably no more than about 3.5 µm. In one embodiment, the glass frit particles have a specific surface area of at least about 0.5 m²/g, preferably at least about 1 m²/g, and most preferably at least about 2 m²/g. At the same time, it is preferred that the specific surface area be no more than about 15 m²/g, preferably no more than about 10 m²/g.

According to another embodiment, the glass frit particles may include a surface coating. Any such coating known in the art and which is considered to be suitable in the context of the invention can be employed on the glass frit particles. Preferred coatings according to the invention include those coatings which promote dispersion of the glass in the organic vehicle and improved contact of the electroconductive paste. If such a coating is present, it is preferred that the coating correspond to no more than about 10 wt %, preferably no more than about 8 wt %, most preferably no more than about 5 wt %, in each case based on the total weight of the glass frit particles.

The electroconductive paste includes at least about 0.5 wt % glass frit, preferably at least about 1 wt %, and most preferably at least about 2 wt %, based upon 100% total weight of the paste. At the same time, the paste preferably includes no more than about 10 wt % glass frit, preferably no more than about 8 wt %, more preferably no more than about 6 wt %, and most preferably no more than about 5 wt %, based upon 100% total weight of the electroconductive paste.

Additives

Preferred additives are components added to the paste, in addition to the other components explicitly mentioned, which contribute to increased electrical performance of the paste, of the electrodes produced thereof, or of the resulting solar cell. In addition to additives present in the glass frit and in the vehicle, additives can also be present in the electroconductive paste separately. Preferred additives include, but are not limited to, thixotropic agents, viscosity regulators, emulsifiers, stabilizing agents or pH regulators, inorganic additives, thickeners and dispersants, or a combination of at least two thereof. Preferred inorganic organometallic additives include, but are not limited to, Mg, Ni, Te, W, Zn, Mg, Gd, Ce, Zr, Ti, Mn, Sn, Ru, Co, Fe, Rh, V, Y, Sb, P, Cu and Cr or a combination of at least two thereof, preferably Zn, Sb, Mn, Ni, W, Te, Rh, V, Y, Sb, P and Ru, or a combination of at least two thereof, oxides thereof, compounds which can generate those metal oxides on firing, or a mixture of at least two of the aforementioned metals, a mixture of at least two of the aforementioned oxides, a mixture of at least two of the aforementioned compounds which can generate those metal oxides on firing, or mixtures of two or more of any of the above mentioned. In a preferred embodiment, the electroconductive paste comprises an additive that promotes adhesion, such as an oxide of manganese, zinc, aluminum, or bismuth.

According to one embodiment, the paste may include at least about 0.1 wt % additive(s). At the same time, the paste preferably includes no more than about 10 wt % additive(s), preferably no more than about 5 wt %, and most preferably no more than about 2 wt %, based upon 100% total weight of the paste. In a most preferred embodiment, the electroconductive paste comprises no more than about 1 wt % additive(s), based upon 100% total weight of the paste.

Forming the Electroconductive Paste Composition

To form an electroconductive paste, the glass frit materials are combined with the conductive metallic particles and organic vehicle using any method known in the art for preparing a paste composition. The method of preparation is not critical, as long as it results in a homogenously dispersed paste. The components can be mixed, such as with a mixer, then passed through a three roll mill, for example, to make a dispersed uniform paste. In addition to mixing all of the components together simultaneously, the raw glass frit materials can be co-milled with silver particles, for example, in a ball mill for 2-24 hours to achieve a homogenous mixture of glass frit and silver particles, which are then mixed with the organic vehicle.

Solar Cells

The invention also relates to a solar cell. In one embodiment, the solar cell comprises a semiconductor substrate (e.g., a silicon wafer) and an electroconductive paste composition according to any of the embodiments described herein.

In another aspect, the invention relates to a solar cell prepared by a process which includes applying an electroconductive paste composition according to any of the embodiments described herein to a semiconductor substrate (e.g., a silicon wafer) and firing the semiconductor substrate.

Silicon Wafer

Preferred wafers according to the invention have regions, among other regions of the solar cell, capable of absorbing light with high efficiency to yield electron-hole pairs and separating holes and electrons across a boundary with high efficiency, preferably across a p-n junction boundary. Preferred wafers according to the invention are those comprising a single body made up of a front doped layer and a back doped layer.

Preferably, the wafer comprises appropriately doped tetravalent elements, binary compounds, tertiary compounds or alloys. Preferred tetravalent elements in this context include, but are not limited to, silicon, germanium, or tin, preferably silicon. Preferred binary compounds include, but are not limited to, combinations of two or more tetravalent elements, binary compounds of a group III element with a group V element, binary compounds of a group II element with a group VI element or binary compounds of a group IV element with a group VI element. Preferred combinations of tetravalent elements include, but are not limited to, combinations of two or more elements selected from silicon, germanium, tin or carbon, preferably SiC. The preferred binary compounds of a group III element with a group V element is GaAs. According to a preferred embodiment of the invention, the wafer is silicon. The foregoing description, in which silicon is explicitly mentioned, also applies to other wafer compositions described herein.

The p-n junction boundary is located where the front doped layer and back doped layer of the wafer meet. In an n-type solar cell, the back doped layer is doped with an electron donating n-type dopant and the front doped layer is doped with an electron accepting or hole donating p-type dopant. In a p-type solar cell, the back doped layer is doped with p-type dopant and the front doped layer is doped with n-type dopant. According to a preferred embodiment of the invention, a wafer with a p-n junction boundary is prepared by first providing a doped silicon substrate and then applying a doped layer of the opposite type to one face of that substrate.

The doped silicon substrate can be prepared by any method known in the art and considered suitable for the invention. Preferred sources of silicon substrates according to the invention include, but are not limited to, mono-crystalline silicon, multi-crystalline silicon, amorphous silicon, and upgraded metallurgical silicon, most preferably mono-crystalline silicon or multi-crystalline silicon. Doping to form the doped silicon substrate can be carried out simultaneously by adding the dopant during the preparation of the silicon substrate, or it can be carried out in a subsequent step. Doping subsequent to the preparation of the silicon substrate can be carried out by gas diffusion epitaxy, for example. Doped silicon substrates are also readily commercially available. According to one embodiment, the initial doping of the silicon substrate may be carried out simultaneously to its formation by adding dopant to the silicon mix. According to another embodiment, the application of the front doped layer and the highly doped back layer, if present, may be carried out by gas-phase epitaxy. This gas phase epitaxy is preferably carried out at a temperature of at least about 500° C., preferably at least about 600° C., and most preferably at least about 650° C. At the same time, the temperature is preferably no more than about 900° C., preferably no more than about 800° C., and most preferably no more than about 750° C. The gas phase epitaxy is preferably carried out at a pressure of at least about 2 kPa, preferably at least about 10 kPa, and most preferably at least about 40 kPa. At the same, the pressure is preferably no more than about 100 kPa, preferably no more than about 80 kPa, and most preferably no more than about 70 kPa.

It is known in the art that silicon substrates can exhibit a number of shapes, surface textures and sizes. The shape of the substrate may include cuboid, disc, wafer and irregular polyhedron, to name a few. According to a preferred embodiment of the invention, the wafer is a cuboid with two dimensions which are similar, preferably equal, and a third dimension which is significantly smaller than the other two dimensions. The third dimension may be at least 100 times smaller than the first two dimensions. Further, silicon substrates with rough surfaces are preferred. One way to assess the roughness of the substrate is to evaluate the surface roughness parameter for a sub-surface of the substrate, which is small in comparison to the total surface area of the substrate, preferably less than about one hundredth of the total surface area, and which is essentially planar. The value of the surface roughness parameter is given by the ratio of the area of the sub-surface to the area of a theoretical surface formed by projecting that sub-surface onto the flat plane best fitted to the sub-surface by minimizing mean square displacement. A higher value of the surface roughness parameter indicates a rougher, more irregular surface and a lower value of the surface roughness parameter indicates a smoother, more even surface. According to the invention, the surface roughness of the silicon substrate is preferably modified so as to produce an optimum balance between a number of factors including, but not limited to, light absorption and adhesion to the surface.

The two larger dimensions of the silicon substrate can be varied to suit the application required of the resultant solar cell. It is preferred according to the invention for the thickness of the silicon wafer to be below about 0.5 mm, more preferably below about 0.3 mm, and most preferably below about 0.2 mm. Some wafers have a minimum thickness of 0.01 mm or more.

It is preferred that the front doped layer be thin in comparison to the back doped layer. It is also preferred that the front doped layer have a thickness of at least about 0.1 µm, and preferably no more than about 10 µm, preferably no more than about 5 and most preferably no more than about 2 µm.

Dopants

Preferred dopants are those which, when added to the silicon wafer, form a p-n junction boundary by introducing electrons or holes into the band structure. It is preferred that the identity and concentration of these dopants is specifically selected so as to tune the band structure profile of the p-n junction and set the light absorption and conductivity profiles as required. Preferred p-type dopants include, but are not limited to, those which add holes to the silicon wafer band structure. All dopants known in the art and which are considered suitable in the context of the invention can be employed as p-type dopants. Preferred p-type dopants include, but are not limited to, trivalent elements, particularly those of group 13 of the periodic table. Preferred group 13 elements of the periodic table in this context include, but are not limited to, boron, aluminum, gallium, indium, thallium, or a combination of at least two thereof, wherein boron is particularly preferred.

Preferred n-type dopants are those which add electrons to the silicon wafer band structure. Preferred n-type dopants are elements of group 15 of the periodic table. Preferred group 15 elements of the periodic table in this context include, but are not limited to, nitrogen, phosphorus, arsenic, antimony, bismuth or a combination of at least two thereof, wherein phosphorus is particularly preferred.

As described above, the various doping levels of the p-n junction can be varied so as to tune the desired properties of the resulting solar cell. Doping levels are measured using secondary ion mass spectroscopy.

According to certain embodiments, the semiconductor substrate (i.e., silicon wafer) exhibits a sheet resistance above about 60 $\Omega/\square$, such as above about 65 $\Omega/\square$, 70 $\Omega/\square$, 90 $\Omega/\square$ or 100 $\Omega\square$. For measuring the sheet resistance of a doped silicon wafer surface, the device "GP4-Test Pro" equipped with software package "GP-4 Test 1.6.6 Pro" (available from GP Solar GmbH) is used. For the measurement, the four point measuring principle is applied. The two outer probes apply a constant current and two inner probes measure the voltage. The sheet resistance is deduced using the Ohmic law in $\Omega/\square$. To determine the average sheet resistance, the measurement is performed on 25 equally distributed spots of the wafer. In an air conditioned room with a temperature of 22±1° C., all equipment and materials are equilibrated before the measurement. To perform the measurement, the "GP-Test.Pro" is equipped with a 4-point measuring head (Part Number 04.01.0018) with sharp tips in order to penetrate the anti-reflection and/or passivation layers. A current of 10 mA is applied. The measuring head is brought into contact with the non-metallized wafer material and the measurement is started. After measuring 25 equally distributed spots on the wafer, the average sheet resistance is calculated in $\Omega/\square$.

Solar Cell Structure

A contribution to achieving at least one of the above described objects is made by a solar cell obtainable from a process according to the invention. Preferred solar cells according to the invention are those which have a high efficiency, in terms of proportion of total energy of incident light converted into electrical energy output, and those which are light and durable. At a minimum, a solar cell includes: (i) front electrodes, (ii) a front doped layer, (iii) a p-n junction boundary, (iv) a back doped layer, and (v) soldering pads. The solar cell may also include additional layers, particularly PERC solar cells, as set forth herein.

Antireflective Layer

According to the invention, an antireflective layer may be applied as the outer layer before the electrode is applied to the front face of the solar cell. In one embodiment, an antireflective layer may also be applied to the back surface of the solar cell as well. All antireflective layers known in the art and which are considered to be suitable in the context of the invention can be employed. Preferred antireflective layers are those which decrease the proportion of incident light reflected by the front face and increase the proportion of incident light crossing the front face to be absorbed by the wafer. Antireflective layers which give rise to a favorable absorption/reflection ratio, are susceptible to etching by the electroconductive paste, are otherwise resistant to the temperatures required for firing of the electroconductive paste, and do not contribute to increased recombination of electrons and holes in the vicinity of the electrode interface, are preferred. Preferred antireflective layers include, but are not limited to, $SiN_x$, $SiO_2$, $Al_2O_3$, $TiO_2$ or mixtures of at least two thereof and/or combinations of at least two layers thereof. According to a preferred embodiment, the antireflective layer is $SiN_x$, in particular where a silicon wafer is employed.

The thickness of antireflective layers is suited to the wavelength of the appropriate light. According to a preferred embodiment of the invention, the antireflective layers have a thickness of at least 20 nm, preferably at least 40 nm, and most preferably at least 60 nm. At the same time, the thickness is preferably no more than about 300 nm, more preferably no more than about 200 nm, and most preferably no more than about 90 nm.

Passivation Layers

One or more passivation layers may be applied to the front and/or back side of the silicon wafer as an outer layer. The front passivation layer(s) may be applied before the front electrode is formed, or before the antireflective layer is applied (if one is present). The backside passivation layer(s) is typically applied during wafer production, such as through plasma vapor deposition techniques. During production of a PERC solar cell, the front antireflective layer is first applied, then the rear passivation layer is applied, and lastly a rear capping layer is applied.

Preferred passivation layers are those which reduce the rate of electron/hole recombination in the vicinity of the electrode interface. Any passivation layer which is known in the art and which is considered to be suitable in the context of the invention can be employed. Preferred passivation layers according to the invention include, but are not limited to, aluminum oxide (e.g., $Al_2O_3$). It is preferred for the passivation layer to have a thickness of at least 0.1 nm, preferably at least 10 nm, and most preferably at least 30 nm. As the same time, the thickness is preferably no more than about 2 μm, preferably no more than about 1 μm, and most preferably no more than about 200 nm.

Additional Protective Layers

In addition to the layers described above, further layers can be added for mechanical and chemical protection. The cell can be encapsulated to provide chemical protection. According to a preferred embodiment, transparent polymers, often referred to as transparent thermoplastic resins, are used as the encapsulation material, if such an encapsulation is present. Preferred transparent polymers in this context are silicon rubber and polyethylene vinyl acetate (PVA). A transparent glass sheet may also be added to the front of the solar cell to provide mechanical protection to the front face of the cell. A back protecting material may be added to the back face of the solar cell to provide mechanical protection. Preferred back protecting materials are those having good mechanical properties and weather resistance. The preferred back protection material according to the invention is polyethylene terephthalate with a layer of polyvinyl fluoride. It is preferred for the back protecting material to be present underneath the encapsulation layer (in the event that both a back protection layer and encapsulation are present).

A frame material can be added to the outside of the solar cell to give mechanical support. Frame materials are well known in the art and any frame material considered suitable in the context of the invention may be employed. The preferred frame material according to the invention is aluminum.

Method of Preparing a PERC Solar Cell

A PERC solar cell is prepared as follows. First, the front side diffusion layer, as set forth above, is formed on the silicon substrate. On the front side of the substrate, an antireflection coating, such as those disclosed herein, is then applied. Next, the rear passivation layer, such as an alumina layer, is applied to the back surface of the substrate, such as by plasma vapor deposition. Additional rear surface layers, such as a silicon nitride capping layer, may then be applied on top of the rear passivation layer. Next, portions of the rear passivation layer and additional rear layers are removed to expose areas of the underlying substrate. This step may be achieved by, for example, acid etching or laser drilling. An aluminum electroconductive paste is then applied on top of the rear layers, thus filling in the "holes" created by removing portions of the rear passivation layer. In these areas, a local back surface field is formed when the aluminum paste is fired. The backside soldering tabs may be applied to the back surface either before or after the application of the aluminum paste. The front side electrodes are also formed concurrently with the backside soldering tabs according to conventional methods known in the art.

An exemplary PERC solar cell is illustrated in FIG. 2. In these Figures, the term "AR" refers to the antireflection layer, the term "BSF" refers to the back surface field, the term "$AlO_x$" refers to the alumina rear passivation layer, the term "$SiN_x$" refers to the rear capping layer, the term "Rear-Al" refers to the rear aluminum paste, and the term "Rear Ag" refers to the backside soldering tabs.

The electroconductive pastes may be applied in any manner known in the art and considered suitable in the context of the invention. Examples include, but are not limited to, impregnation, dipping, pouring, dripping on, injection, spraying, knife coating, curtain coating, brushing or printing or a combination of at least two thereof. Preferred printing techniques are ink-jet printing, screen printing, tampon printing, offset printing, relief printing or stencil printing or a combination of at least two thereof. It is preferred according to the invention that the front side and backside electroconductive pastes are applied by printing, preferably by screen printing. Specifically, the screens preferably have mesh opening with a diameter of about 40 μm or less (e.g., about 35 μm or less, about 30 μm or less). At the same time, the screens preferably have a mesh opening with a diameter of at least 10 μm.

The substrate is then subjected to one or more thermal treatment steps, such as, for example, conventional over drying, infrared or ultraviolet curing, and/or firing. In one embodiment the substrate may be fired according to an appropriate profile. Firing sinters the printed electroconductive paste so as to form solid electrodes. Firing is well known in the art and can be effected in any manner considered suitable in the context of the invention. It is preferred that firing be carried out above the $T_g$ of the glass frit materials.

According to the invention, the maximum temperature set for firing is below about 1000° C., preferably below about 900° C. Furnace set temperatures as low as about 800° C. have been employed for obtaining solar cells. Firing temperatures should also allow for effective sintering of the metallic particles to be achieved. The firing temperature profile is typically set so as to enable the burnout of organic materials from the electroconductive paste composition. The firing step is typically carried out in air or in an oxygen-containing atmosphere in a belt furnace. It is preferred for firing to be carried out in a fast firing process with a total firing time of at least 30 seconds, and preferably at least 40 seconds. At the same time, the firing time is preferably no more than about 3 minutes, more preferably no more than about 2 minutes, and most preferably no more than about 1 minute. The time that the wafer temperature is above 600° C. is most preferably in a range from about 3 to 7 seconds. The substrate may reach a peak temperature in the range of about 700 to 975° C. for a period of about 1 to 5 seconds. The firing may also be conducted at high transport rates, for example, about 100-700 cm/min, with resulting hold-up times of about 0.5 to 3 minutes. Multiple temperature zones, for example 3-12 zones, can be used to control the desired thermal profile.

Firing of electroconductive pastes on the front and back faces can be carried out simultaneously or sequentially. Simultaneous firing is appropriate if the electroconductive pastes applied to both faces have similar, preferably identical, optimum firing conditions. Where appropriate, it is preferred for firing to be carried out simultaneously. Where firing is carried out sequentially, it is preferable for the back electroconductive paste to be applied and fired first, followed by application and firing of the electroconductive paste to the front face of the substrate.

Measuring Properties of Electroconductive Paste

The electrical performance of a solar cell is measured using a commercial IV-tester "cetisPV-CTL1" from Halm Elektronik GmbH. All parts of the measurement equipment as well as the solar cell to be tested are maintained at 25° C. during electrical measurement. This temperature should be measured simultaneously on the cell surface during the actual measurement by a temperature probe. The Xe Arc lamp simulates the sunlight with a known AM1.5 intensity of 1000 W/m² on the cell surface. To bring the simulator to this intensity, the lamp is flashed several times within a short period of time until it reaches a stable level monitored by the "PVCTControl 4.313.0" software of the IV-tester. The Halm IV tester uses a multi-point contact method to measure current (I) and voltage (V) to determine the solar cell's IV-curve. To do so, the solar cell is placed between the multi-point contact probes in such a way that the probe fingers are in contact with the bus bars (i.e., printed lines) of the solar cell. The numbers of contact probe lines are adjusted to the number of bus bars on the cell surface. All electrical values were determined directly from this curve automatically by the implemented software package. As a reference standard, a calibrated solar cell from ISE Freiburg consisting of the same area dimensions, same wafer material, and processed using the same front side layout, was tested and the data was compared to the certificated values. At least five wafers processed in the very same way were measured and the data was interpreted by calculating the average of each value. The software PVCTControl 4.313.0 provided values for efficiency (Eta), fill factor (FF), short circuit current (Jsc), series resistance (Rs) and open circuit voltage (Voc).

Solar Cell Module

A plurality of solar cells according to the invention can be arranged spatially and electrically connected to form a collective arrangement called a module. Preferred modules according to the invention can have a number of arrangements, preferably a rectangular arrangement known as a solar panel. A large variety of ways to electrically connect solar cells, as well as a large variety of ways to mechanically arrange and fix such cells to form collective arrangements, are well known in the art. Preferred methods according to the invention are those which result in a low mass to power output ratio, low volume to power output ration, and high durability. Aluminum is the preferred material for mechanical fixing of solar cells according to the invention.

In one embodiment, multiple solar cells are connected in series and/or in parallel and the ends of the electrodes of the first cell and the last cell are preferably connected to output wiring. The cell connectors are bonded to the area where the backside soldering tabs have been formed. The solar cells are typically encapsulated in a transparent thermal plastic resin, such as silicon rubber or ethylene vinyl acetate. A transparent sheet of glass is placed on the front surface of the encapsulating transparent thermal plastic resin. A back protecting material, for example, a sheet of polyethylene terephthalate coated with a film of polyvinyl fluoride, is placed under the encapsulating thermal plastic resin. These layered materials may be heated in an appropriate vacuum furnace to remove air, and then integrated into one body by heating and pressing. Furthermore, since solar cells are typically left in the open air for a long time, it is desirable to cover the circumference of the solar cell with a frame material consisting of aluminum or the like.

The invention will now be described in conjunction with the following, non-limiting examples.

EXAMPLE 1

A first set of exemplary electroconductive paste compositions and a reference electroconductive paste composition was prepared according to the compositions set forth in Table 1 below. All values are provided in weight percent based upon 100% total weight of the paste composition. The glass frit in each paste was formed of about 75.5 wt % of ($SiO_2$+$B_2O_3$+$Bi_2O_3$), about 13 wt % of alkaline metal oxide(s), about 9.6 wt % of ZnO, and about 1.9 wt % of $Nb_2O_5$, based upon 100% total weight of the glass frit.

TABLE 1

Exemplary Paste Formulations

| | Ref. | P1-1 | P1-2 |
|---|---|---|---|
| Silver powder | 64 | 64 | 64 |
| Glass frit | 4 | 4 | 4 |
| Silicone Oil 1 (viscosity = 5 kcps) | 0 | 1.5 | 0 |
| Silicone Oil 2 (viscosity = 30 kcps) | 0 | 0 | 1.5 |
| $MnO_2$ | 0.5 | 0.5 | 0.5 |
| Organic vehicle | 31.5 | 30 | 30 |

Each of the exemplary paste formulations was then printed on the backside of a PERC wafer to form backside soldering tabs. In this example, a standard front side paste (SOL9621E manufactured by Heraeus Precious Metals North America Conshohocken LLC of West Conshohocken, Pa.) was screen printed onto the front side of the PERC wafer using a screen with 280 mesh stainless steel wire, at about 35 µm wire diameters and 5 µm EOM, to form the finger lines and busbars. The PERC wafers used were obtained commercially from Sunrise Global Solar Energy Co., Ltd. of Yilan, Taiwan (Wafer 1) and SolarWorld Americas Inc. of Hillsboro, Oreg. (Wafer 2). The PERC wafers already had a locally opened rear passivation layer applied to its backside. To that, the exemplary and reference pastes of Example 1 were printed on the back surface to form the backside soldering tabs, which extended across the full length of the cell and were about 3.5 mm wide and 1.53 mm in length. Next, a commercially available aluminum backside paste (RUX28K30 manufactured by Guangzhou Ruxing Technology Development Co., Ltd. of Guangdong, China) was printed over the backside of the wafer to form an aluminum back surface field in the locally opened areas of the rear passivation layer and slightly overlapping the backside soldering tabs. The cell was then dried at an appropriate temperature. The silicon substrate, with the printed front side and backside paste, was then fired at a peak temperature of approximately 700-975° C.

Electrical testing of each of the exemplary PERC solar cells was then performed according to the parameters set forth herein. The electrical performance results are provided in Table 2 below. All of the data has been normalized with respect to 100 based upon the reference paste data. As can be seen, both of the exemplary paste formulations exhibited improved open circuit voltage (Voc) as compared to the reference paste composition. Thus, the presence of the silicone oil, regardless of which type was used, was shown to improve electrical performance of the paste composition.

TABLE 2

Electrical Performance of Exemplary Paste Compositions

| | Ref. | P1-1 | P1-2 |
|---|---|---|---|
| Voc, V (Wafer 1) | 100 | 100.3647 | 100.2993 |
| Voc, V (Wafer 2) | 100 | 100.4418 | 100.4335 |

EXAMPLE 2

A second set of exemplary pastes was prepared according to the compositions set forth in Table 3 below. All values are provided in weight percent based upon 100% total weight of the paste composition. The glass frit in each of these pastes was formed of about 82 wt % of ($SiO_2+B_2O_3+Bi_2O_3$), about 10 wt % of alkaline metal oxide(s), about 5 wt % of ZnO, about 1 wt % of $Nb_2O_5$, and about 2 wt % of $MoO_3$, based upon 100% total weight of the glass frit. Silicon Oil 2 is the same as that disclosed in Example 1.

TABLE 3

Exemplary Paste Compositions

|  | Ref. | P4-1 | P4-2 | P4-3 | P4-4 | P4-5 | P4-6 | P4-7 | P4-8 |
|---|---|---|---|---|---|---|---|---|---|
| Silver powder | 64 | 64 | 64 | 64 | 64 | 64 | 64 | 64 | 64 |
| Glass frit | 4 | 4 | 4 | 4 | 4 | 4 | 4 | 4 | 4 |
| MnO2 | 1 | 1 | 1 | 1 | 1 | 1 | 1 | 1 | 1 |
| Silicone Oil 2 | 0 | 0.2 | 0.5 | 1 | 1.5 | 2 | 2.5 | 3 | 4 |
| Organic vehicle | 31 | 30.8 | 30.5 | 30 | 29.5 | 29 | 28.5 | 28 | 27 |

Each of the exemplary paste formulations was then printed on the backside of a PERC wafer and electrical performance testing was performed according to the parameters set forth in Example 1. In this example, the PERC wafer that was used was purchased commercially from JinkoSolar Holding Co., Ltd. of Shanghai, China.

The electrical performance results are provided in Table 4 below. All of the data has been normalized with respect to 100 based upon the reference paste data. As can be seen, all of the exemplary paste formulations exhibited improved efficiency (Eta, %) as compared to the reference paste composition.

TABLE 4

Electrical Performance of Exemplary Paste Compositions

|  | P4-0 | P4-1 | P4-2 | P4-3 | P4-4 | P4-5 | P4-6 | P4-7 | P4-8 |
|---|---|---|---|---|---|---|---|---|---|
| Eta, % | 100 | 100.189 | 100.239 | 100.143 | 100.618 | 100.503 | 100.645 | 100.537 | 100.118 |

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

The invention claimed is:

1. A passivated emitter rear solar cell, comprising:
a silicon substrate having a front and back surface;
a rear passivation layer on the back surface of the silicon substrate having a plurality of open holes formed therein;
an aluminum back contact layer formed in the open holes of the rear passivation layer; and
at least one backside soldering tab on the back surface of the silicon substrate,
wherein the backside soldering tab is formed from an electroconductive paste composition comprising conductive metallic particles, at least one lead-free glass frit, an adhesion promoting additive comprising $MnO_2$, and an organic vehicle comprising at least one silicone oil.

2. The passivated emitter rear solar cell of claim 1, wherein the rear passivation layer comprises alumina.

3. The passivated emitter rear solar cell of claim 1, further comprising a rear capping layer formed between the rear passivation layer and the aluminum back contact layer.

4. The passivated emitter rear solar cell of claim 3, wherein the rear capping layer comprises silicon nitride.

5. The passivated emitter rear solar cell of claim 1, wherein the conductive metallic particles are present in the electroconductive paste composition in an amount of less than about 70 wt %, based upon 100% total weight of the paste.

6. The passivated emitter rear solar cell of claim 1, wherein the conductive metallic particles are silver particles.

7. The passivated emitter rear solar cell of claim 6, wherein the silver particles comprise a mixture of spherical silver powder and flake-shaped silver particles.

8. The passivated emitter rear solar cell of claim 1, wherein the silicone oil is present in the electroconductive paste composition in an amount of about 0.2 to about 3.5 wt %, based upon 100% total weight of the electroconductive paste composition.

9. The passivated emitter rear solar cell of claim 1, wherein the at least one lead-free glass frit comprises:
(i) $SiO_2$, $B_2O_3$, and $Bi_2O_3$, wherein the total content of $SiO_2$, $B_2O_3$, and $Bi_2O_3$ is at least about 70 wt %, based upon 100% total weight of the glass frit;
(ii) at least 5 wt % of at least one alkaline oxide; and
(iii) at least 2 wt % of $MoO_3$.

10. The passivated emitter rear solar cell of claim 9, wherein the at least one lead-free glass frit further comprises $Nb_2O_5$ in an amount of less than about 2 wt %, based upon 100% total weight of the glass frit.

11. The passivated emitter rear solar cell of claim 1, further comprising an antireflection layer formed on the front surface of the silicon substrate.

12. The passivated emitter rear solar cell of claim 11, further comprising a front electrode formed on the antireflection layer.

13. The passivated emitter rear solar cell of claim 1, wherein the organic vehicle is present in an amount of at least about 5 wt % and no more than about 60 wt %, based upon 100% total weight of the electroconductive paste composition.

14. The passivated emitter rear solar cell of claim 1, wherein the at least one silicone oil has a viscosity of about 1-40 kcps.

15. A method of preparing a passivated emitter rear solar cell, comprising the steps of:
(i) applying a backside electroconductive paste composition to a rear surface of a silicon substrate having at least one rear passivation layer formed thereon, the rear passivation layer having a plurality of open holes formed therein to expose areas of the silicon substrate;

(ii) applying an aluminum electroconductive paste composition in the open holes of the rear passivation layer to contact the silicon substrate; and (iii) heating the silicon substrate, wherein the backside electroconductive paste composition comprises conductive metallic particles, at least one lead-free glass frit, an adhesion promoting additive comprising $MnO_2$, and an organic vehicle comprising at least one silicone oil.

16. The method of claim 15, wherein the silicon substrate further includes a rear capping layer on top of the rear passivation layer.

17. The method of claim 16, wherein the plurality of open holes are formed in the rear passivation layer and rear capping layer.

18. The method of claim 15, wherein step (i) is performed by screen printing.

19. The method of claim 15, wherein step (iii) is performed at temperatures of 700-975° C.

20. A passivated emitter rear solar cell, comprising:

a silicon substrate having a front and back surface;

a rear passivation layer on the back surface of the silicon substrate having a plurality of open holes formed therein;

an aluminum back contact layer formed in the open holes of the rear passivation layer; and at least one backside soldering tab on the back surface of the silicon substrate, wherein the backside soldering tab is formed from an electroconductive paste composition comprising conductive metallic particles, at least one lead-free glass frit, and an organic vehicle comprising at least one silicone oil, the at least one glass frit comprising:

(i) $SiO_2$, $B_2O_3$, and $Bi_2O_3$, wherein the total content of $SiO_2$, $B_2O_3$, and $Bi_2O_3$ is at least about 70 wt %, based upon 100% total weight of the glass frit;

(ii) at least 5 wt % of at least one alkaline oxide; and (iii) at least 2 wt % of $MoO_3$.

* * * * *